United States Patent
Lin et al.

(10) Patent No.: US 10,982,314 B2
(45) Date of Patent: Apr. 20, 2021

(54) MASK PLATE ASSEMBLY CAPABLE OF PREVENTING WRINKLE AND ASSEMBLY METHOD THEREOF

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Zhiming Lin, Beijing (CN); Zhen Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/564,369

(22) PCT Filed: Feb. 24, 2017

(86) PCT No.: PCT/CN2017/074774
§ 371 (c)(1),
(2) Date: Oct. 4, 2017

(87) PCT Pub. No.: WO2017/215286
PCT Pub. Date: Dec. 21, 2017

(65) Prior Publication Data
US 2018/0202034 A1    Jul. 19, 2018

(30) Foreign Application Priority Data
Jun. 17, 2016  (CN) .......................... 201610438013.6

(51) Int. Cl.
*C23C 14/04*    (2006.01)
*C23C 14/24*    (2006.01)
(Continued)

(52) U.S. Cl.
CPC ............ *C23C 14/042* (2013.01); *C23C 14/24* (2013.01); *H01L 51/56* (2013.01); *H01L 51/0011* (2013.01)

(58) Field of Classification Search
CPC ..... C23C 14/042; C23C 14/044; C23C 14/12; C23C 14/24; H01L 51/0011; H01L 51/56; G03F 1/64
See application file for complete search history.

(56) References Cited

U.S. PATENT DOCUMENTS 3,841,261 A * 10/1974 Hudson .................. B05C 17/06
                                                    118/505
5,847,813 A * 12/1998 Hirayanagi ......... G03F 7/70433
                                                    355/75
(Continued)

FOREIGN PATENT DOCUMENTS

CN    203034082 U    7/2013
CN    103668049 A    3/2014
(Continued)

OTHER PUBLICATIONS

USPTO NFOA dated Dec. 14, 2018 in connection with U.S. Appl. No. 15/813,504.
(Continued)

*Primary Examiner* — Karl Kurple

(57) ABSTRACT

Disclosed are a mask plate and an assembly method thereof. The mask plate includes a covering bar; a support bar; and at least one mask sheet, the mask sheet includes one mask area, a mask pattern is distributed in the entire mask area; and the covering bar and the support bar are intersected with each other to divide the mask area into a plurality of mask units. Thus, the mask sheet will not produce wrinkle in different degrees upon being stretched, in this way, the accuracy of the deposited or evaporated pattern can be (Continued)

US 10,982,314 B2

Page 2 improved, and the yield of the mask plate can be improved as well.

15 Claims, 7 Drawing Sheets

(51) Int. Cl.
*H01L 51/56* (2006.01)
*H01L 51/00* (2006.01)

(56) References Cited

U.S. PATENT DOCUMENTS

| | | | | |
|---|---|---|---|---|
| 6,162,566 | A * | 12/2000 | Amemiya | B82Y 10/00 378/35 |
| 6,204,509 | B1 | 3/2001 | Yahiro et al. | |
| 6,277,658 | B1 | 8/2001 | Jeng et al. | |
| 7,006,202 | B2 * | 2/2006 | Byun | G03F 7/2014 355/53 |
| 8,343,278 | B2 * | 1/2013 | Sung | C23C 14/042 118/504 |
| 8,646,406 | B2 * | 2/2014 | Ahn | C23C 14/042 118/505 |
| 2002/0102754 | A1 | 8/2002 | Fujimori et al. | |
| 2004/0020435 | A1 | 2/2004 | Tsuchiya et al. | |
| 2005/0019968 | A1 | 1/2005 | Kuwahara et al. | |
| 2008/0018236 | A1 * | 1/2008 | Arai | C23C 14/042 313/504 |
| 2009/0151630 | A1 * | 6/2009 | Marcanio | C23C 14/042 118/504 |
| 2010/0323302 | A1 * | 12/2010 | Hanazaki | G03F 1/62 430/325 |
| 2011/0067630 | A1 * | 3/2011 | Ko | C23C 14/042 118/721 |
| 2011/0146573 | A1 * | 6/2011 | Park | C23C 14/042 118/712 |
| 2011/0229633 | A1 * | 9/2011 | Hong | H01L 51/0011 427/162 |
| 2012/0276473 | A1 * | 11/2012 | Tsukada | G03F 1/64 430/5 |
| 2014/0041586 | A1 * | 2/2014 | Wu | H01L 51/0011 118/720 |
| 2014/0158046 | A1 * | 6/2014 | Kim | C23C 16/042 118/505 |
| 2015/0101536 | A1 * | 4/2015 | Han | C23C 14/042 118/721 |
| 2016/0312354 | A1 * | 10/2016 | Ko | C23C 14/042 |
| 2017/0081758 | A1 * | 3/2017 | Inoue | C23C 14/04 |
| 2018/0209029 | A1 * | 7/2018 | Lin | C23C 14/24 |
| 2018/0312957 | A1 * | 11/2018 | Zhang | C23C 14/12 |
| 2020/0216944 | A1 * | 7/2020 | Chun | C23C 14/06 |

FOREIGN PATENT DOCUMENTS

| | | |
|---|---|---|
| CN | 103695841 A | 4/2014 |
| CN | 103938153 A | 7/2014 |
| CN | 204529949 U | 8/2015 |
| CN | 105002464 A | 10/2015 |
| CN | 105039907 A | 11/2015 |
| CN | 105063552 A | 11/2015 |
| CN | 105839052 A | 8/2016 |

OTHER PUBLICATIONS

The International Search Report and Written Opinion dated Jun. 6, 2017; PCT/CN2017/074774.
The First Chinese Office Action dated May 11, 2017; Appln. No. 201610438013.6.
The Second Chinese Office Action dated Oct. 10, 2017: Appln. No. 201610438013.6.
PESR Appln 17771973.9 Issued Feb. 19, 2020.

* cited by examiner

MASK PLATE ASSEMBLY CAPABLE OF PREVENTING WRINKLE AND ASSEMBLY METHOD THEREOF

TECHNICAL FIELD

Embodiments of the present invention relate to a mask plate and an assembly method thereof.

BACKGROUND

Organic light-emitting diode (OLED) display is a self-luminescent display device, and is more and more popular in the market due to the advantages of low power consumption, high display brightness, wide viewing angle, rapid response speed, etc.

Fine metal mask (FMM) sheet is a mask sheet for depositing deposition materials on a substrate to be deposited and forming fine patterns. The FMM sheet generally comprises a plurality of openings for the deposition materials to go through, e.g., a plurality of square slits or strip slits, so as to deposit the deposition materials on the substrate and form the fine patterns.

SUMMARY

At least one embodiment of the present disclosure provides a mask plate and an assembly method thereof. The mask plate includes a covering bar, a support bar and at least one mask sheet, the mask sheet includes one mask area, a mask pattern is distributed in the entire mask area; and the covering bar and the support bar are intersected with each other to divide the mask area into a plurality of mask units. Thus, the mask sheet will not produce wrinkle in different degrees upon being stretched, so as to improve the accuracy of the mask plate, and improve the product yield of the mask plate as well.

At least one embodiment of the present disclosure provides a mask plate, which includes a covering bar, a support bar and at least one mask sheet, the mask sheet includes one mask area, a mask pattern is distributed in the entire mask area; and the covering bar and the support bar are intersected with each other to divide the mask area into a plurality of mask units.

For example, in the mask plate provided by an embodiment of the present disclosure, in a direction perpendicular to a plane of the mask sheet, a length of an edge of a cross section of the covering bar or the support bar away from the mask sheet is less than that of an edge close to the mask sheet.

For example, in the mask plate provided by an embodiment of the present disclosure, the cross section of the covering bar or the support bar is a rectangle obtained by removing two corners at the edge away from the mask sheet.

For example, in the mask plate provided by an embodiment of the present disclosure, the mask unit includes a dummy area located at an edge and an active area located at an inner side of the dummy area.

For example, in the mask plate provided by an embodiment of the present disclosure a width of the dummy area has a range from 10 to 100 nm.

For example, in the mask plate provided by an embodiment of the present disclosure the covering bar and the support bar are vertically intersected with each other to define the plurality of mask units having a rectangular shape.

For example, in the mask plate provided by an embodiment of the present disclosure the mask plate further comprises a frame; and the mask sheet is partially overlapped with the covering bar, so as to completely shield an opening of the frame.

For example, in the mask plate provided by an embodiment of the present disclosure, the at least one mask sheet comprises a plurality of mask sheets; in a direction perpendicular to the covering bar, the covering bar and the mask sheets are alternately arranged; the covering bar and the mask sheet which are adjacent to each other are overlapped with each other; two ends of the covering bar are fixed on the frame; and at least a part of the covering bar is located between two adjacent mask sheets, so as to shield a gap between the two adjacent mask sheets.

For example, in the mask plate provided by an embodiment of the present disclosure, two ends of the support bar are fixed on the frame and configured to support the mask sheet.

For example, in the mask plate provided by an embodiment of the present disclosure, two ends of the mask sheet are fixed on the frame and are in a tight state.

For example, in the mask plate provided by an embodiment of the present disclosure, the mask plate further includes an alignment bar, fixed on the frame and configured to align the covering bar or the support bar.

For example, in the mask plate provided by an embodiment of the present disclosure, the covering bar is arranged in parallel to the alignment bar; and the support bar is arranged perpendicular to the alignment bar.

For example, in the mask plate provided by an embodiment of the present disclosure, the alignment bar is provided with a recess for accommodating the support bar; and an end portion of the support bar is disposed in the recess.

For example, in the mask plate provided by an embodiment of the present disclosure, the frame is provided with a recess for accommodating the support bar; and an end portion of the support bar is disposed in the recess.

For example, in the mask plate provided by an embodiment of the present disclosure, the frame is provided with a plurality of lug bosses; the alignment bar is correspondingly provided with a plurality of openings; the plurality of lug bosses are respectively extended from the plurality of openings; and end portions of the support bar are fixed on the top of the plurality of lug bosses.

For example, in the mask plate provided by an embodiment of the present disclosure, in a direction perpendicular to a plane of the mask sheet, the frame, the alignment bar, the covering bar, the support bar and the mask sheet are superimposed in sequence.

For example, in the mask plate provided by an embodiment of the present disclosure, in the direction perpendicular to a plane of the mask sheet, the frame, the alignment bar, the support bar, the covering bar and the mask sheet are superimposed in sequence.

At least one embodiment of the present disclosure further provides an assembly method of a mask plate, wherein the mask plate includes: a frame, a covering bar, a support bar and at least one mask sheet, the mask sheet including one mask area, a mask pattern being distributed in the entire mask area, the covering bar and the support bar being intersected with each other to divide the mask area into a plurality of mask units, the assembly method of the mask plate includes: fixing two ends of the covering bar on the frame; fixing two ends of the support bar on the frame; and fixing two ends of the mask sheet on the frame, and allowing the mask sheet to be in a tight state.

For example, in the assembly method of the mask plate provided by an embodiment of the present disclosure, wherein the mask further comprises an alignment bar; and the assembly method of the mask plate includes: fixing the alignment bar on the frame before fixing two ends of the covering bar and the support bar on the frame, wherein the alignment bar is arranged in parallel to the covering bar and arranged perpendicular to the support bar.

For example, in the assembly method of the mask plate provided by an embodiment of the present disclosure, wherein the alignment bar, the covering bar, the support bar and the mask sheet are fixed on the frame by welding.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention, not limitative to the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," and so on which are used in the description and the claims of the present application for invention, are not intended to indicate any sequence, amount or importance, but distinguish various components. The terms "includes," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
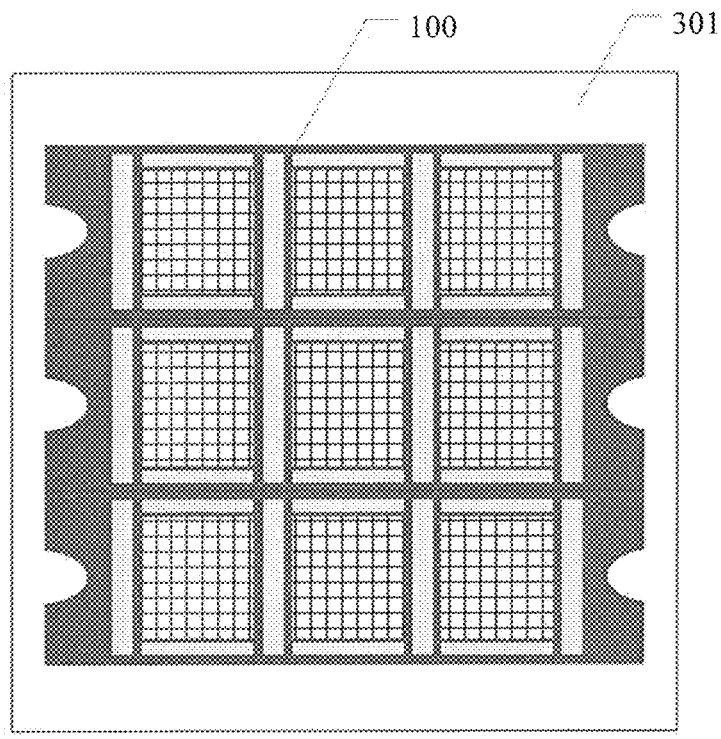
FIG. 1 is a schematic plan view of an FMM.
Figure 2:
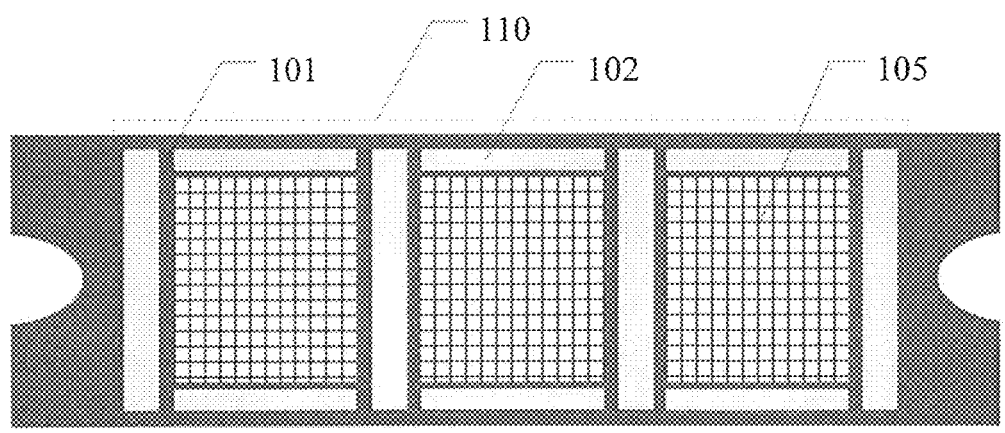
FIG. 2 is a schematic plan view of an FMM sheet.

As sown in FIG. 1, an FMM includes a frame 301 and a plurality of FMM sheets 100 fixed on the frame 301. In general, in order to improve the patterning accuracy and avoid the drop of the FMM sheets due to its own gravity, the FMM sheets must be stretched before being fixed on the frame 301. The inventor(s) of the application notice that: as shown in FIG. 2, the FMM sheet with high precision and ultra-high precision generally includes a solid part 101, a partially etched part 102 and a plurality of mask units 105 within a deposition or evaporation range 110. The solid part 101 is a part of the FMM sheet not provided with a pattern, namely a part which is not etched; the partially etched part 102 is a part of the FMM sheet which is partially etched and is a part which is not completely etched and does not allow deposition or evaporation materials to go through; and the mask unit 105 is a part provided with a deposited or evaporated pattern, namely a part which is completely etched, and includes a plurality of openings for the deposition or evaporation materials to go through, e.g., a plurality of square slits or a plurality of strip slits. As the solid part 101, the partially etched part 102 and the plurality of mask units 105 have different thicknesses and structures, the solid part 101, the partially etched part 102 and the mask units 105 will produce wrinkle in different degrees upon being stretched. Thus, various poor defects will be caused when the FMM sheet is used for deposition or evaporation.

Embodiments of the present invention provide a mask plate and an assembly method thereof. The mask plate includes a covering bar, a support bar and at least one mask sheet. The mask sheet includes one mask area; a mask pattern is distributed in the entire mask area; and the a covering bar and the a support bar are intersected with each other to define the mask area and divide the mask area into a plurality of mask units. Thus, the mask sheet will not produce wrinkle in different degrees upon being stretched, in this way, the matching accuracy between the mask plate and a substrate to be deposited or evaporated can be improved, and hence the accuracy of the deposited or evaporated pattern can be improved, and the yield of the mask plate can be improved as well.

Hereafter, the mask plate and the assembly method thereof provided by the embodiments of the present disclosure will be described with reference to the accompanying drawings.

First Embodiment

Figure 3:
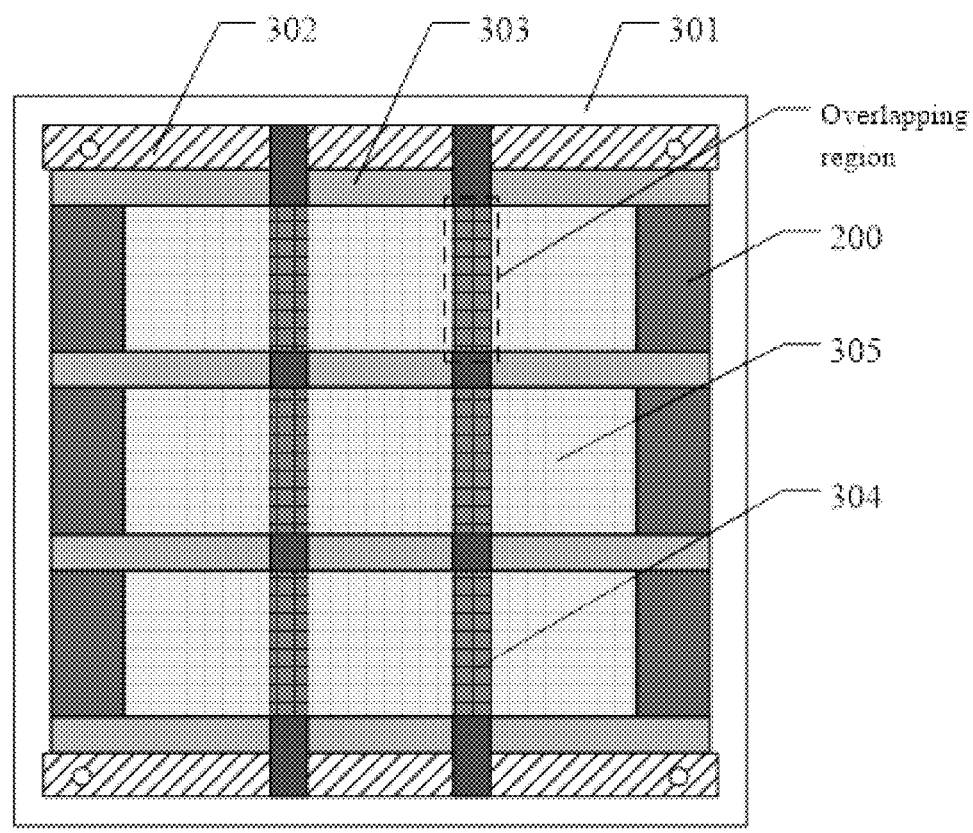
FIG. 3 is a schematic plan view of a mask plate provided by an embodiment of the present invention.
Figure 4:
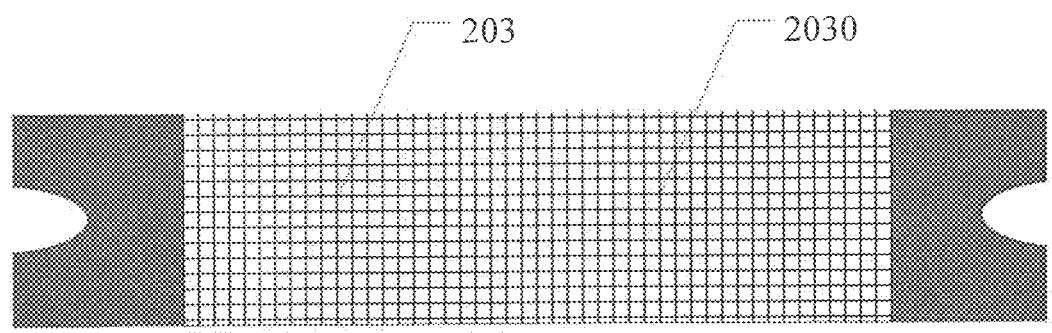
FIG. 4 is a schematic plan view of a mask sheet provided by an embodiment of the present invention.

The embodiment provides a mask plate. As illustrated in FIG. 3, the mask plate comprises a covering bar 303, a support bar 304 and at least one mask sheet 200. As shown in FIG. 4, the mask sheet 200 includes one mask area 203; a mask pattern 2030 (e.g., a fine mask pattern) is distributed in the entire mask area 203; and the mask sheet 200 does not include a solid part and a partially etched part. For instance, the mask pattern 2030 may include an aperture or a hole extending through the mask sheet, e.g., a plurality of square slits or a plurality of strip slits, for deposition or evaporation materials to go through. In the mask plate provided by the embodiment, as shown in FIG. 3, the covering bar 303 and the support bar 304 may be intersected with each other to define the mask area 203 and divide the mask area 203 into a plurality of mask units 305. It should be noted that the covering bar 303 and the support bar 304 can prevent the deposition or evaporation materials from being deposited or evaporated at areas provided with the a covering bar 303 and the a support bar 304, so the accurate division of the mask units 305 can be realized by utilization of the accurate positioning of the covering bar 303 and the support bar 304. In addition, the description that the mask sheet includes one mask area may refer to that one mask sheet only includes one mask area. The description that the mask pattern is distributed in the entire mask area refers to that the mask area only includes the mask pattern. It should be noted that the mask pattern also includes a part not going through the mask sheet; the part not running through the mask sheet are different from the solid part and the partially etched part; and a thin-film pattern is formed by the part not running through the mask sheet and the part going through the mask sheet together in the deposition or evaporation process. The solid part and the partially etched part are not used for forming the thin-film pattern. For instance, when the mask plate provided by the embodiment is used for manufacturing an organic emission layer of an OLED display, in the case of evaporating green organic luminous patterns on a substrate, a part of the mask pattern corresponding to the green organic luminous patterns on the substrate are the part running through the mask sheet, and a part of the mask pattern corresponding to other parts (e.g., blue organic luminous patterns or red organic luminous patterns) on the substrate are the part not going through the mask sheet. In addition, the solid part and the partially etched part do not include the part not running through the mask sheet.

In the mask plate provided by the embodiment, as the mask sheet includes one uniform mask pattern and does not include the solid part, the partially etched part and the plurality of mask units, the mask plate can prevent wrinkle in different degrees produced by the solid part, the partially etched part and the mask units in the stretching process of the mask sheet. On one hand, the mask plate can improve the matching accuracy between the mask plate and the substrate to be deposited or evaporated and the flatness of the mask plate, and hence improve the accuracy of the deposited or evaporated thin-film pattern. On the other hand, the mask plate can also improve the yield of the mask plate. Although the mask sheet in the embodiment does not include the mask units, the covering bar and the support bar may be intersected with each other to define the mask area and divide the mask area into the plurality of mask units, and hence replace the function of the solid part.

For instance, the materials of the mask sheet may include one or more selected from stainless steel, nickel, cobalt, nickel alloy and nickel cobalt alloy.

For instance, in the mask plate provided by one example of the embodiment, as shown in FIG. 3, the covering bar 303 and the support bar 304 are vertically intersected with each other to define the plurality of rectangular mask units 305. It should be noted that the rectangle includes square. Of course, the embodiment of the present invention includes but is not limited thereto. According to the shape of the actually required thin-film pattern, the covering bar and the support bar may define the mask area and divide the mask area into shapes same with the shape of the required thin-film pattern, e.g., polygons, triangles, or circles. In this case, the mask plate provided by the embodiment may be applicable to the deposition or evaporation process of thin-film patterns in different shapes by redesigning the covering bar and the support bar, and hence can reduce the development cost of the mask plate.

For instance, in the mask plate provided by one example of the embodiment, as shown in FIG. 3, the mask plate further comprises a frame 301. The mask sheet 200 is partially overlapped with the covering bar 303, so as to completely shield openings of the frame 301.

For instance, in the mask plate provided by one example of the embodiment, the number of the mask sheets is numerous. For instance, as shown in FIG. 3, the mask plate comprises three mask sheets 200 arranged side by side. In a extension direction perpendicular to the covering bar 303, the covering bar 303 and the mask sheets 200 are alternately arranged; the covering bar 303 and the mask sheet 200 which are adjacent to each other are overlapped with each other; two ends of the covering bar 303 are fixed on the frame 301; and at least partial covering bar 303 is disposed between two adjacent mask sheets 200, so as to shield a gap between the two adjacent mask sheets 200. Thus, deposition or evaporation materials can be prevented from entering other areas, except areas corresponding to the mask units 305, on the substrate to be deposited or evaporated, so that the accuracy of the deposited or evaporated thin-film pattern can be guaranteed. In addition, in the mask plate provided by the embodiment, the mask sheets may adopt close contact or may also be spaced for a certain distance, as long as the gap between the two adjacent mask sheets can be shielded by the covering bar.

For instance, in the mask plate provided by one example of the embodiment, as shown in FIG. 3, two ends of the support bar 304 are fixed on the frame 301; and the support bar 304 may be configured to support the mask sheet 200. On one hand, the support bar and the covering bar 303 define the mask area together and divide the mask area into the plurality of mask units 305. On the other hand, the support bar can further prevent the mask sheets 200 from sagging due to its own gravity.

For instance, in the mask plate provided by one example of the embodiment, as shown in FIG. 3, two ends of the mask sheet 200 are fixed on the frame 301 and in a tight state, so as to prevent the drop of the mask sheet 200 due to its own gravity and hence improve the accuracy of the thin-film pattern deposited or evaporated by the mask plate provided by the embodiment of the present invention.

For instance, in the mask plate provided by one example of the embodiment, as shown in FIG. 3, the mask plate further comprises an alignment bar 302 which is fixed on the frame 301 and configured to align the covering bar 303 or the support bar 304. Thus, as the alignment bar 302 are fixed on the frame 301, the covering bar 303 or the support bar 304 can be more accurately fixed and hence more accurately define the mask area and divide the mask area into the plurality of mask units 305.

For instance, the covering bar 303 may be arranged in parallel to the alignment bars 302 for alignment, and the support bar 304 may be arranged perpendicular to the alignment bars 302 for alignment. The covering bar or the support bar may also be combined with the alignment bars by other means to realize alignment.

Figure 5:
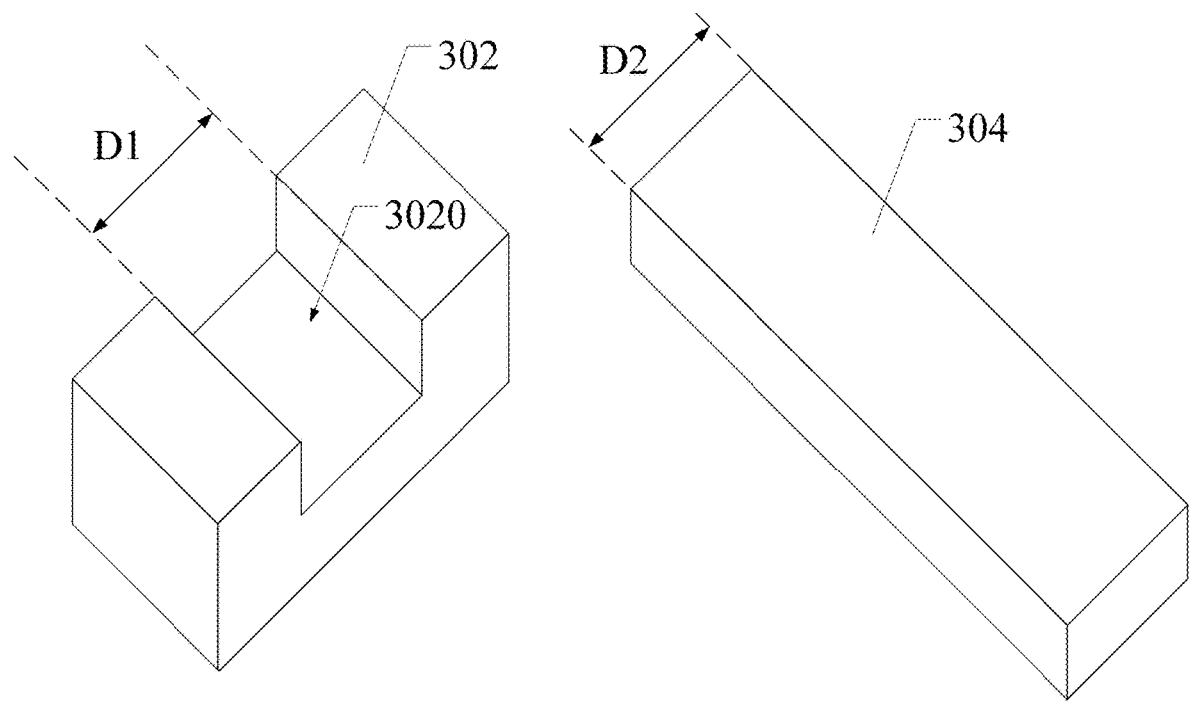
FIG. 5 is a schematic diagram of an alignment bar and a recess thereof provided by an embodiment of the present invention.

For instance, in the mask plate provided by one example of the embodiment, as shown in FIG. 5, the alignment bar 302 may be provided with a recess 3020 for accommodating the support bar 304; an end portion of the support bar 304 may be disposed in the recess 3020; and the alignment of the support bar 304 is realized by disposing the support bar 304 in the recess 3020. For instance, the extension direction of the recess 3020 formed on the alignment bar 302 may be perpendicular to the extension direction of the alignment bar 302; the support bar 304 is disposed in the recess 3020; and the extension direction of the support bar is same with the extension direction of the recess 3020. Thus, upon the support bar 304 being disposed in the recess 3020, the support bar may be guaranteed to be perpendicular to the alignment bar 302. It should be noted that the width D1 of the recess 3020 may be equal to the width D2 of the support bar 304. Of course, the embodiment of the present invention includes but is not limited thereto. The width D1 of the recess 3020 may also be greater than the width D2 of the support bar 304. For instance, D1 is 400-600 μm larger than D2. In addition, the covering bar may also be aligned by arranging an alignment bar perpendicular to the above alignment bar and arranging a corresponding recess.

For instance, in the mask plate provided by one example of the embodiment, the bottom of the support bar and the alignment bar may be simultaneously welded on the frame. Thus, the stability of the support bar and the alignment bar can be improved.

Figure 6:
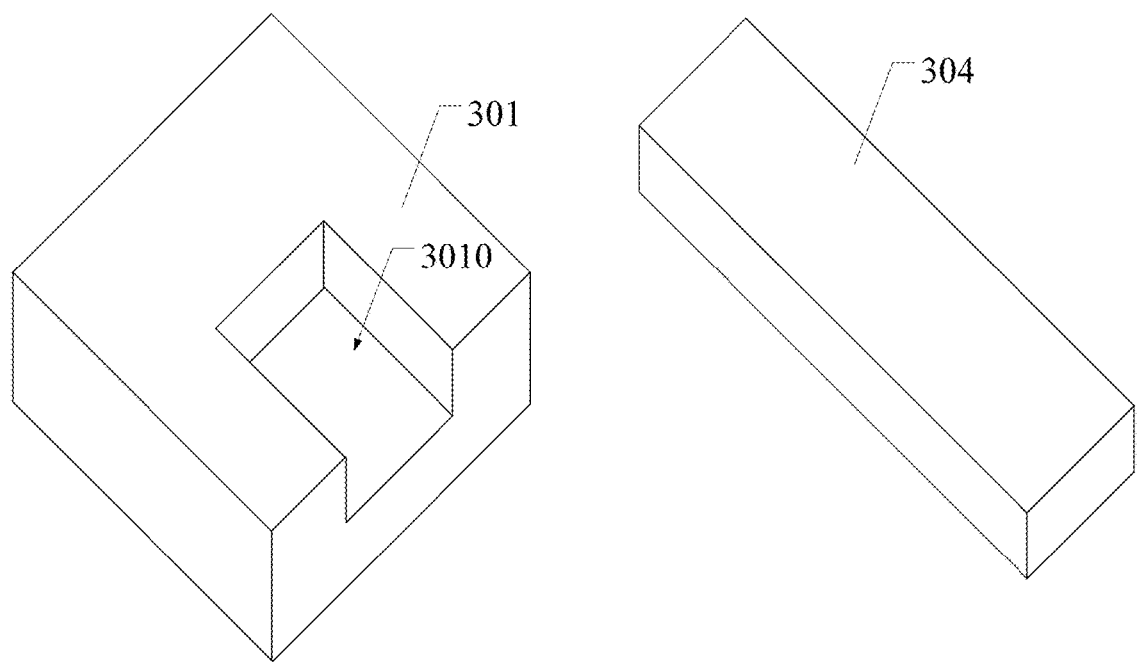
FIG. 6 is a schematic diagram of a recess in a frame provided by an embodiment of the present invention.
Figure 7:
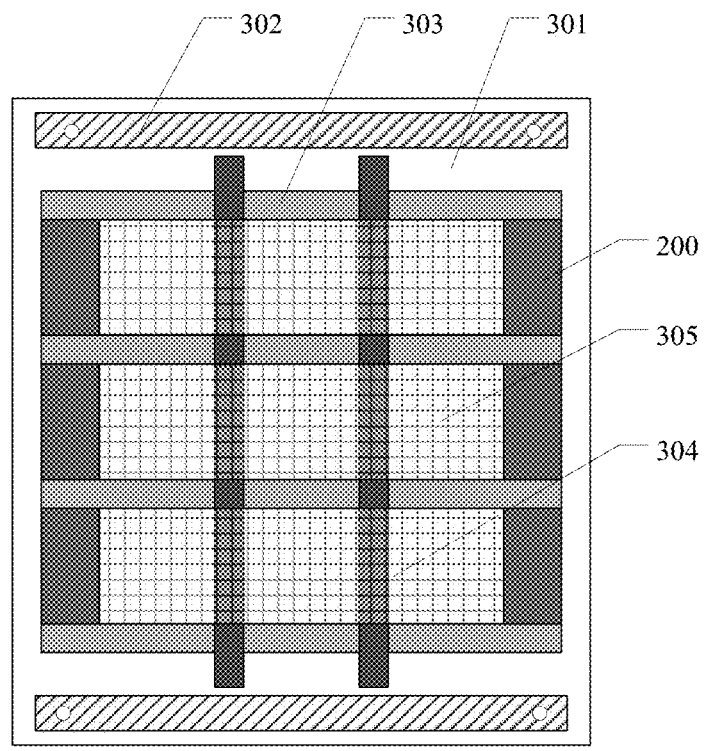
FIG. 7 is a schematic plan view of another mask plate provided by an embodiment of the present invention.
Figure 8:
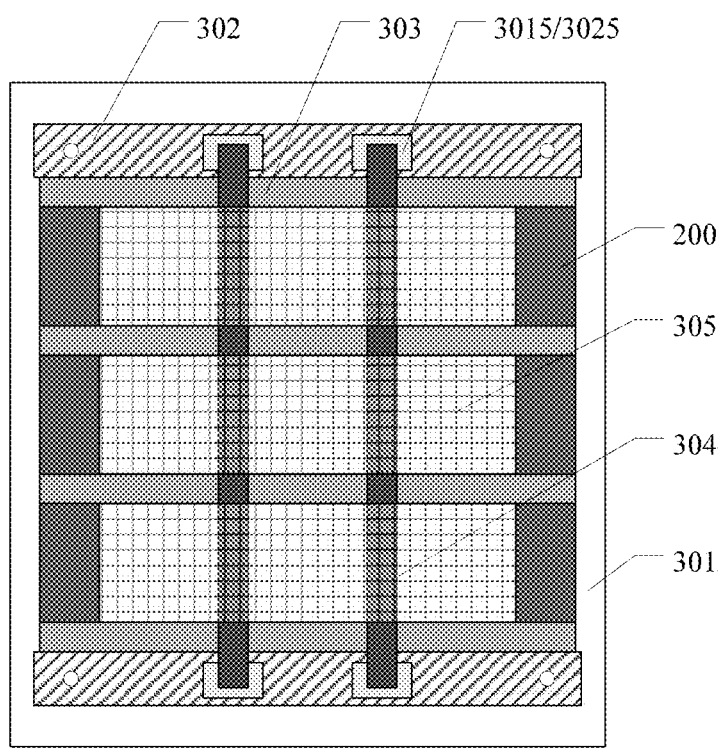
FIG. 8 is a schematic plan view of another mask plate provided by the an embodiment of the present invention.

For instance, in the mask plate provided by one example of the embodiment, as shown in FIG. 6, the frame 301 may also be provided with recesses 3010 for accommodating the support bar 304; an end portion of the support bar 304 may be disposed in the recess 3010; and the alignment of the support bar 304 is realized by disposing the support bar 304 in the recess 3010. It should be noted that: as shown in FIG. 7, when the support bar 304 is disposed in the recess 3010 to realize the alignment of the support bar 304, the alignment bar 302 may be disposed on the outside of the frame 301 away from the recess 3010, so as to avoid the alignment bar 302 from being affected by the welding of the support bar 304. In addition, the size of the recess 3010 may refer to the shape of the recess 3020 on the alignment bar 302. The repeated portions will be omitted herein.

For instance, in the mask plate provided by one example of the embodiment, the frame 301 is provided with a plurality of lug bosses 3015; the alignment bar 302 is correspondingly provided with a plurality of openings 3025; the plurality of lug bosses 3015 are respectively extended from the plurality of openings 3025; and end portions of the support bar 304 are fixed on the top of the plurality of lug bosses 3015.

For instance, the frame 301 may be provided with a plurality of lug bosses 3015 at the positions at which the alignment bars 302 are to be arranged; the alignment bars 302 are correspondingly provided with a plurality of openings 3025; and the alignment bars 302 may be accurately fixed on the frame 301 by allowing the plurality of lug bosses 3015 to go through the plurality of openings 3025. It should be noted that the size of the lug boss 3015 may be equal to the size of the opening 3025. Of course, the embodiment of the present invention includes but is not limited thereto. The size (e.g., length or width) of the opening 3025 may also be 80-120 μm larger than the size of the lug boss 3015, e.g., 100 μm.

For instance, in the mask plate provided by one example of the embodiment, the height of the lug boss 3015 is greater than the thickness of the alignment bar 302. For instance, the height of the lug boss 3015 is 8-12 μm larger than the thickness of the alignment bar 302. Thus, the support bar 304 may be fixed on the plurality of lug bosses 3015 of the frame 301, so the alignment bars 302 will not be affected in the process of repairing the support bar 304.

For instance, the top of the lug boss may be stepped. That is to say, the top of the lug boss may also be provided with a recess for accommodating the support bar, and the alignment of the support bar is realized by disposing the support bar in the recess. The shape of the recess may refer to the shape of the recess 3010 on the frame 301 as shown in FIG. 7. The repeated portions will be omitted herein.

For instance, in the mask plate provided by one example of the embodiment, the mask plate may comprise a plurality of alignment bars. The accuracy of the position of the covering bar or the support bar can be further improved by arranging more alignment bars on the frame.

For instance, in the mask plate provided by the embodiment, in the direction perpendicular to a plane of the mask sheet, the frame, the alignment bar, the covering bar, the support bar and the mask sheets may be superimposed to each other in sequence. It should be noted that in the direction perpendicular to the plane of the mask sheet, the frame, the alignment bar, the support bar, the covering bar and the mask sheets may also be superimposed to each other in sequence.

Figure 9A:
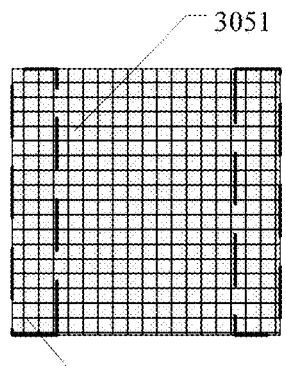
FIG. 9a is a schematic plan view of a mask unit in an embodiment of the present invention.
Figure 9B:
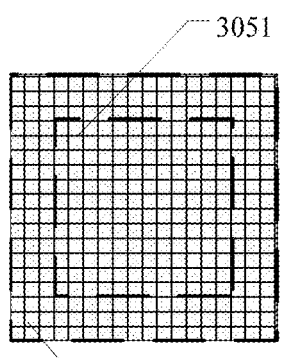
FIG. 9b is a schematic plan view of another mask unit in an embodiment of the present invention.

For instance, in the mask plate provided by one example of the embodiment, as shown in FIGS. 9a and 9b, the mask unit 305 includes a dummy area 3050 disposed at the edge and an active area 3051 disposed at inner side of the dummy area 3050. The active area 3051 is configured to deposit or evaporate the required thin-film pattern, and the dummy area 3050 may be used for avoiding the large thickness of the covering bar or the support bar from adversely affecting deposition or evaporation. As shown in FIG. 9a, the dummy area 3050 may be disposed on two opposite sides at the edge of the mask unit 305 (for instance, two opposite sides along the extension direction of the covering bar or the support bar), but the present invention includes but is not limited thereto. As shown in FIG. 9b, the dummy area 3050 may also be disposed at the periphery of the mask unit 305. It should be noted that the edge refers to the outermost area of the mask unit.

Figure 10:
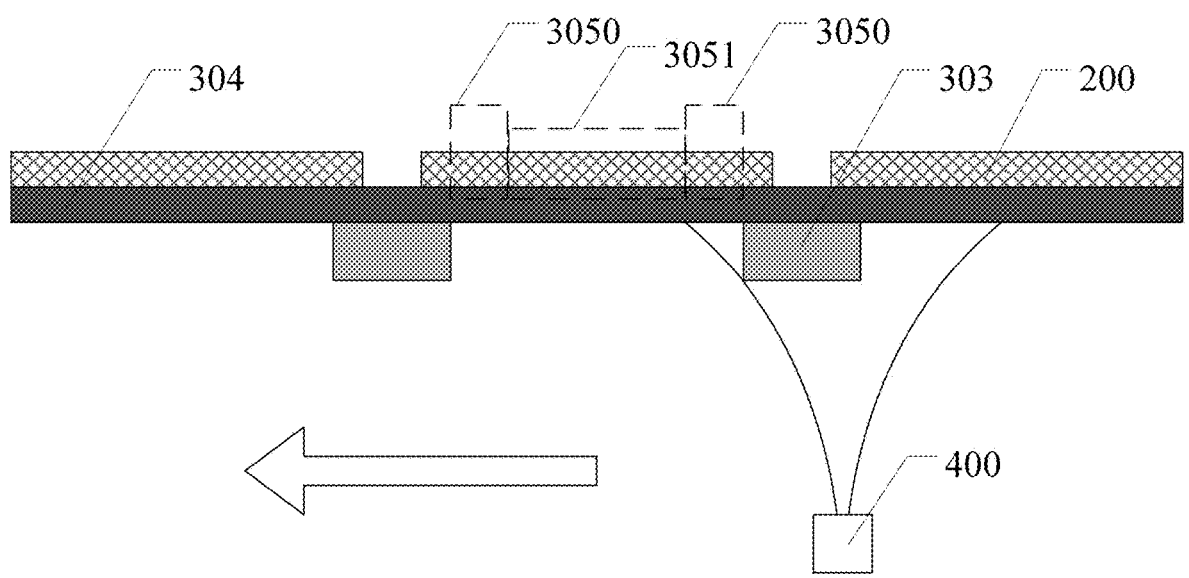
FIG. 10 is a schematic diagram upon a mask plate provided by an embodiment of the present invention being used for evaporation.

For instance, as shown in FIG. 10, when an evaporation source 400 is adopted for evaporation, the evaporation source 400 runs through the mask plate in a scanning manner for evaporation. In the scanning direction of the evaporation source 400 (taking the extension direction of the support bar 304 as an example), as the covering bar 303 have certain thickness, when the evaporation source 400 runs through the covering bar 303, evaporation materials will be shielded to a certain degree, so the deposition thickness of the evaporation materials at areas on both sides of the covering bar 303 will be smaller than that in other areas. Therefore, by arrangement of the dummy areas, e.g., areas on both sides of the covering bar, in the mask unit, the deposited or evaporated thin-film pattern in the areas is not taken as the active area, so the product yield can be improved. For instance, when an organic emission layer is evaporated by adoption of the mask plate provided by the embodiment, circuits or electronic elements, e.g., thin-film transistors (TFTs), matched with the evaporated organic luminous patterns may be not disposed in areas on the substrate corresponding to the dummy areas of the mask units, so the evaporated organic luminous patterns in this area are not taken as working areas of an OLED display. And the dummy areas may even be removed in the subsequent processes. In addition, the position of the dummy area may be set according to the scanning direction of the actual evaporation source. For instance, when the evaporation source takes the extension direction of the support bar as the scanning direction, the dummy area may be disposed on two opposite sides at the edge of the mask unit along the extension direction of the covering bar (namely areas on both sides of the covering bar); and when the evaporation source takes the extension direction of the covering bar as the scanning direction, the dummy area may be disposed on two opposite sides at the edge of the mask unit along the extension direction of the covering bar (namely areas on two sides of the support bar). Of course, the embodiment of the present invention includes but not limited thereto. The dummy area may also be disposed at the periphery of the mask unit. That is to say, the dummy area may be simultaneously disposed on the two opposite sides at the edge of the mask unit along the extension direction of the support bar and the two opposite sides at the edge of the mask unit along the extension direction of the covering bar.

It should be noted that the dummy area of the mask unit may adopt the same pattern with the active area, so the dummy area and the active area have same structure, and hence the folds in different degrees will not be caused due to stretching.

For instance, in the mask plate provided by one example of the embodiment, the width range of the dummy area is 10-100 μm. Of course, the embodiment of the present invention includes but not limited thereto. The width of the dummy area may be set according to the width of an area of the mask unit affected by the covering bar or the support bar in the actual use process.

For instance, in the mask plate provided by one example of the embodiment, the width of the dummy area is 80 μm.

For instance, in the mask plate provided by one example of the embodiment, in the direction perpendicular to a plane of the mask sheet 200, the length of one side of the cross section of the covering bar 303 or the support bar 304 away from the mask sheet 200 is less than the length of one side close to the mask sheet 200.

Figure 11:
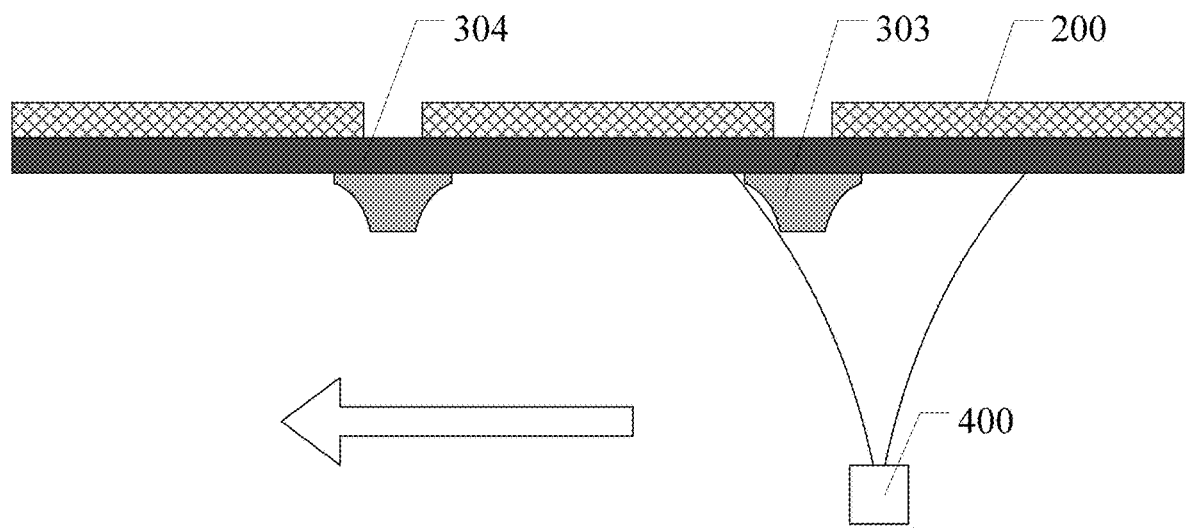
FIG. 11 is a schematic diagram upon another mask plate provided by an embodiment of the present invention being used for evaporation.

For instance, as shown in FIG. 11, when the evaporation source 400 is adopted for evaporation, the evaporation source 400 runs through the mask plate in a scanning manner for evaporation. In the scanning direction of the evaporation source 400 (taking the extension direction of the support bar 304 as an example), as the length of the cross section of the covering bar 303 away from the mask sheet 200 is less than the length of one side close to the mask sheet 200, the influence of the covering bar 303 on the evaporation of the evaporation source 400 can be reduced or even eliminated. Meanwhile, as one side of the covering bar 303 close to the mask sheet 200 still has long length, not only the gap between the mask sheets can be shielded but also the mask units can be accurately defined, and the deposition or evaporation materials can be prevented from entering other areas, except the areas corresponding to the mask units, on the substrate.

Figure 12:
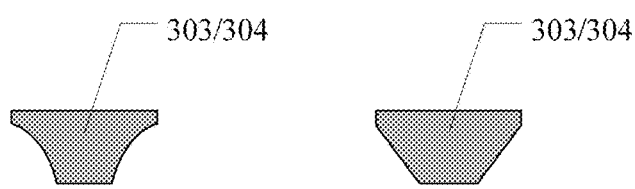
FIG. 12 is a schematic sectional view of a covering bar or a support bar in an embodiment of the present invention.

For instance, in the mask plate provided by one example of the embodiment, as shown in FIG. 12, the cross section of the covering bar 303 or the support bar 304 is a rectangle obtained by removing two corners at the edge away from the mask sheet. Of course, the embodiment of the present invention includes but not limited thereto.

For instance, as shown in FIG. 12, the removed two angles may be triangles or sectors.

It should be noted that the two technical proposals of solving the influence of the covering bar or the support bar on evaporation, namely the arrangement of the dummy areas and the setting of the length of one side of the cross section of the covering bar or the support bar away from the mask sheet to be less than the length of one side close to the mask sheet, may be independently used and may also be combined in use.

For instance, in the mask plate provided by one example of the embodiment, the mask plate may be an FMM. The mask plate may be applied in the evaporation process. For instance, the mask plate is used for evaporating the organic emission layer of the OLED display device.

Second Embodiment

The embodiment provides an assembly method of a mask plate. The mask plate includes a frame, a covering bar, a support bar and at least one mask sheet. The mask sheet includes one mask area; a mask pattern is distributed in the entire mask area; and the covering bar and the support bar are intersected with each other to define the mask area and divide the mask area into a plurality of mask units. The assembly method of the mask plate comprises the following steps S210-S230.

Figure 14:
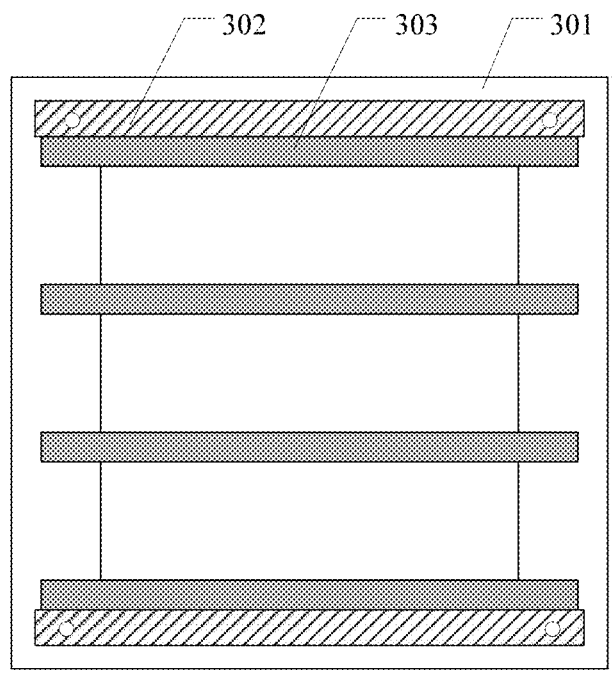

S210: as shown in FIG. 14, fixing two ends of the covering bar 303 on the frame 301.

Figure 15:
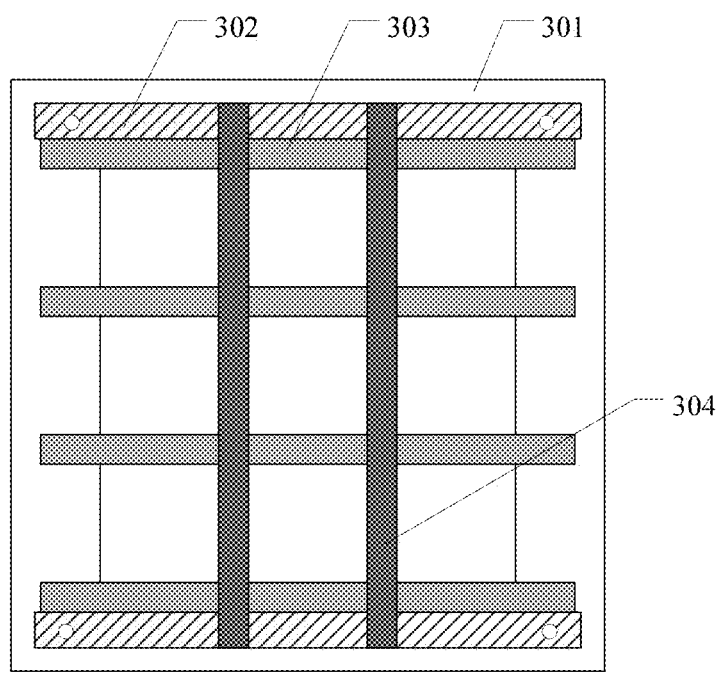

S220: as shown in FIG. 15, fixing two ends of the support bar 304 on the frame 301.

S230: as shown in FIG. 3, fixing two ends of the mask sheet 200 on the frame 301, and allowing the mask sheets to be in a tight state.

For instance, as shown in FIG. 3, three mask sheets 200 are fixed on the frame 301 side by side.

In the assembly method of the mask plate, provided by the embodiment, as the mask sheet is not provided with mask units, the covering bar and the support bar may be intersected with each other to define the mask area and divide the mask area into the plurality of mask units.

Figure 13:
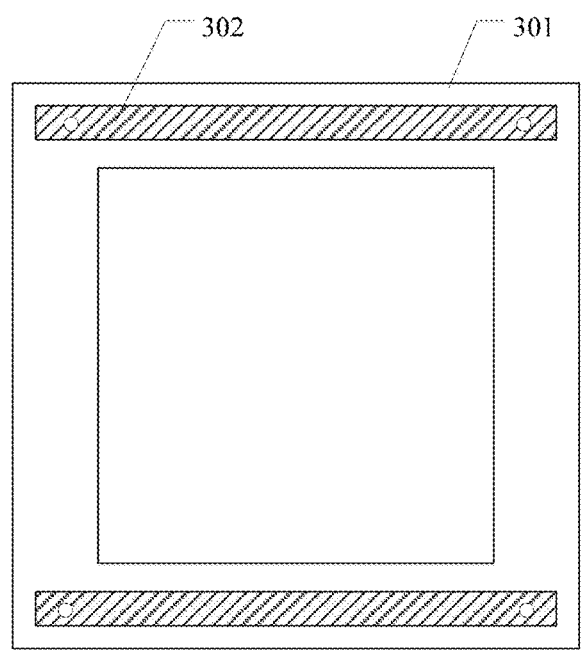
FIGS. 13-15 are schematic diagrams of an assembly method of a mask plate, provided by an embodiment of the present invention.

For instance, in the assembly method of the mask plate provided by one example of the embodiment, the mask plate further includes an alignment bar. As shown in FIG. 13, the assembly method of the mask plate further comprises: fixing alignment bars 302 on the frame 301 before fixing the two ends of the covering bar 303 and the support bar 304 on the frame 301. The alignment bars 302 may be arranged in parallel to the covering bar 303 and arranged perpendicular to the support bar 304. Of course, the embodiment includes but is not limited thereto. The covering bar or the support bar may also be combined with the alignment bars in other means to realize alignment. For instance, the alignment bar 302 may be provided with recesses 3020 for accommodating the support bar, and the alignment of the support bar 304 is realized by disposing the support bar 304 in the recess 3020. For instance, the extension direction of the recess 3020 formed on the alignment 302 may be perpendicular to the extension direction of the alignment bar 302; the support bar 304 is disposed in the recess 3020; and the extension direction of the support bar is the same with the extension direction of the recess 3020. Thus, when the support bar 304 is disposed in the recess 3020, the support bar may be guaranteed to be perpendicular to the alignment bar 302. It should be noted that the width D1 of the recess 3020 may be equal to the width D2 of the support bar 304. Of course, the embodiment of the present invention includes but not limited thereto. The width D1 of the recess 3020 may also be greater than the width D2 of the support bar 304. For instance, D1 is 400-600 μm larger than D2. In addition, the covering bar may also be aligned by arranging alignment bars perpendicular to the above alignment bars and arranging corresponding recesses.

In the assembly method of the mask plate provided by the embodiment, the alignment bars are adopted for accurate alignment of the covering bar and the support bar, so the position of the covering bar and the support bar can be more accurate. Thus, the mask area can be more accurately divided into the plurality of mask units, so the accuracy of the deposited or evaporated thin-film pattern can be improved.

For instance, in the assembly method of the mask plate provided by the embodiment, the plurality of alignment bars may be fixed on the frame, so as to further improve the accuracy of the position of the covering bar or the support bar.

For instance, in the assembly method of the mask plate provided by one example of the embodiment, the alignment bars, the covering bar, the support bar and the mask sheets may be fixed on the frame by welding. Of course, the embodiment of the present invention includes but not limited thereto. The alignment bar, the covering bar, the support bar and the mask sheets may also be fixed by other fixing means such as rivet connection or threaded connection.

The following points should be noted:

(1) The accompanying drawings in the embodiments of the present invention only involve structures relevant to the embodiments of the present invention, and other structures may refer to the prior art.

(2) For clarity, in the accompanying drawings of the embodiments of the present invention, the thickness and the size of layers or microstructures are enlarged. It should be understood that: when an element such as a layer, a film, a region or a substrate is referred to as being disposed "on" or "beneath" another element, the element may be "directly" disposed "on" or "beneath" another element, or an intermediate element may be provided.

(3) The characteristics in the same embodiment or different embodiments of the present invention may be mutually combined without conflict.

The foregoing is only the preferred embodiments of the present invention and not intended to limit the scope of protection of the present invention. The scope of protection of the present invention should be defined by the appended claims.

The application claims priority to the Chinese patent application No. 201610438013.6, filed Jun. 17, 2016, the disclosure of which is incorporated herein by reference as part of the application.

The invention claimed is:

1. A mask plate assembly, comprising:
a covering bar;
a support bar; and
at least one mask sheet,
wherein the mask sheet comprises one mask area, a mask pattern is distributed in an entire area of the mask area; and the covering bar and the support bar are intersected with each other to divide the mask area into a plurality of mask units,
wherein the mask pattern on a plane of the mask sheet and an orthographic projection of the support bar on the plane of the mask sheet have an overlapping region, and the mask pattern in the overlapping region and the mask pattern in the plurality of mask units have a same structure,
the covering bar, the support bar, and the at least one mask sheet are independent components,
the mask plate assembly further comprises a frame and an alignment bar, the mask sheet is partially overlapped with the covering bar, so as to completely shield an opening of the frame, the alignment bar is fixed on the frame and configured to align the covering bar or the support bar, the support bar is disposed in a recess of the alignment bar, the frame and the alignment bar are independent components, the frame, the alignment bar, the support bar, and the covering bar are located on a same side of the mask sheet.

2. The mask plate assembly according to claim 1, wherein, in a direction perpendicular to the plane of the mask sheet, the covering bar or the support bar defines a cross sectional shape with two edges, a first edge being closer to the mask sheet than a second edge, and the first edge being longer than the second edge.

3. The mask plate assembly according to claim 2, wherein the cross sectional shape defined by the covering bar or the support bar is rectangular with two corners adjacent to the second edge being removed.

4. The mask plate assembly according to claim 1, wherein the mask unit comprises a dummy area and an active area, the dummy area being located at an outer edge of the mask unit.

5. The mask plate assembly according to claim 4, wherein a width of the dummy area has a range from 10 to 100 μm.

6. The mask plate assembly according to claim 1, wherein the covering bar and the support bar are vertically intersected with each other to define the plurality of mask units having a rectangular shape.

7. The mask plate assembly according to claim 1, wherein the at least one mask sheet comprises a plurality of mask sheets; in a direction perpendicular to the covering bar, the covering bar and the mask sheets are alternately arranged; the covering bar and the mask sheet which are adjacent to each other are overlapped with each other; two ends of the covering bar are fixed on the frame; and at least a part of the covering bar is located between two adjacent mask sheets, so as to shield a gap between the two adjacent mask sheets.

8. The mask plate assembly according to claim 1, wherein two ends of the support bar are fixed on the frame and configured to support the mask sheet.

9. The mask plate assembly according to claim 1, wherein two ends of the mask sheet are fixed on the frame.

10. The mask plate assembly according to claim 1, wherein the covering bar is arranged in parallel to the alignment bar; and the support bar is arranged perpendicular to the alignment bar.

11. The mask plate assembly according to claim 10, wherein an end portion of the support bar is disposed in the recess.

12. The mask plate assembly according to claim 10, wherein the frame is provided with a recess for accommodating the support bar; and an end portion of the support bar is disposed in the recess.

13. The mask plate assembly according to claim 10, wherein the frame is provided with a plurality of lug bosses; the alignment bar is correspondingly provided with a plurality of openings; the plurality of lug bosses are respectively extended from the plurality of openings; and end portions of the support bar are fixed on the top of the plurality of lug bosses.

14. The mask plate assembly according to claim 1, wherein, in a direction perpendicular to the plane of the mask sheet, the frame, the alignment bar, the covering bar, the support bar and the mask sheet are superimposed in a sequence.

15. The mask plate assembly according to claim 1, wherein, in a direction perpendicular to the plane of the mask sheet, the frame, the alignment bar, the support bar, the covering bar and the mask sheet are superimposed in a sequence.

\* \* \* \* \*